United States Patent [19]

Sakamoto et al.

[11] Patent Number: 4,964,806
[45] Date of Patent: Oct. 23, 1990

[54] SURFACE-MOUNTING CONNECTOR

[75] Inventors: Yukio Sakamoto; Takeshi Tanabe; Iwao Fukutani; Toshio Hori, all of Nagaokakyo, Japan

[73] Assignee: Murata Manufacturing Co., Ltd., Japan

[21] Appl. No.: 498,455

[22] Filed: Mar. 20, 1990

Related U.S. Application Data

[63] Continuation of Ser. No. 287,892, Dec. 21, 1988, abandoned.

[30] Foreign Application Priority Data

Dec. 21, 1987 [JP] Japan ............... 62-194179[U]

[51] Int. Cl.$^5$ .............................................. H01R 9/09
[52] U.S. Cl. .................................... 439/79; 439/80
[58] Field of Search ................ 439/79, 80, 76, 55, 439/65, 629; 361/394, 395, 399, 413

[56] References Cited

U.S. PATENT DOCUMENTS

| | | | |
|---|---|---|---|
| 2,844,807 | 7/1958 | McMulkin | 439/79 |
| 3,653,006 | 3/1972 | Kohler | 439/74 |
| 3,676,746 | 7/1972 | Kassabgi et al. | 439/55 |
| 4,573,104 | 2/1986 | Kamada | 361/399 |
| 4,600,256 | 7/1986 | Anttila | 439/79 |

Primary Examiner—Neil Abrams
Attorney, Agent, or Firm—Ostrolenk, Faber, Gerb & Soffen

[57] ABSTRACT

A surface mounting type connector has a connector plug on its front and has a connector housing from which connector pins project at the rear. The connector pin holder is placed at the rear of the connector housing, and has through holes formed therein. Each of these through holes in positioned corresponding to one of the connector pins. On the inner surfaces of the through holes, through-hole conductors are formed. On one or both main planes of the connector pin holder, conductive patterns are connected to each of the through-hole conductors. Each of the tips of the connector pins is inserted into one of the through holes in the connector pin holder, and these tips of the connector pins are connected to the corresponding conductive patterns via the through-hole conductors. The connector housing is mounted onto the circuit board with its bottom plane on the circuit board, and the conductive patterns on the connector pin holder are connected to correspond with circuit patterns that are formed on the surface of the circuit board.

5 Claims, 4 Drawing Sheets

4,964,806

SURFACE-MOUNTING CONNECTOR

This is a continuation of application Ser. No. 287,892, filed on Dec. 21, 1988, now abandoned.

BACKGROUND OF THE INVENTION

1. The Field of the Invention

This invention relates to a surface mounting type connector. More specifically, this invention relates to a surface mounting type connector (hereinafter referred to as a "connector") which includes a connector housing mounted on the surface of a circuit board, and connector pins which protect from the rear of the connector housing.

2. Description of Background Art

FIGS. 1A-1C represent examples of previous connectors. On the circuit board 1, a male or female connector 2 is mounted as shown in the Figures. This connector 2 comprises a connector housing 3 which has a connector plug 3a and pins 4a and 4b which project from the rear 3b of the connector housing 3. Also, as indicated in the examples in FIGS. 1A-1C, the tips of the connector pins 4a and 4b are bent, and are connected by these bent tips to the circuit pattern (not indicated in the figures) on the circuit board 1.

In previous connectors, it was necessary to bend the tips of the connector pins 4a and 4b and the process for bending them required substantial time, so that there was an increase in cost. That is because, if the bending rate or the bending angle is not accurately regulated, an error in the mutual pitch between the connector pins 4a and 4b is created and it becomes impossible to accurately connect them to the circuit pattern on the circuit board 1.

SUMMARY OF THE INVENTION

Therefore, the principal object of this invention is to provide a newly designed connector.

Another object of this invention is to provide a connector which can be mounted accurately and easily onto a circuit board.

A further object of this invention is to provide a connector which requires no bending process for the connector pins.

Another object of this invention is to provide an inexpensive connector.

A connector according to an aspect of this invention comprises a connector housing in front of which the connector plugs are formed, connector pins which are placed on the connector housing so that the tip of each pin projects from the rear of the connector housing, a connector pin holder which is placed on the rear of the connector housing and having through-holes, and having each of these through-holes placed in correspondence with the location of each of the connector pins, and conductive patterns formed in relation to the through-holes on the surface of the connector pin holder. Also, the tips of the connector pins are each in the through-holes of the connector pin holder and connected to the conductive pattern; the connector housing is mounted on the circuit board; and the conductive pattern of the connector pin holder is connected to the circuit pattern on the circuit board.

With the connector pins which project from the rear of the connector housing inserted into the through-holes which are formed in the connector pin holder, the bottom of the connector housing is installed on the circuit board. And, with the connector pin holder mounted on the circuit board, the conductor pattern of the connector pin holder and the circuit pattern of the circuit board are, for example, soldered together. Thus, the connector pin holder is mechanically stabilized on the circuit board, and at the same time, the conductive pattern on the connector pin holder, and thereby the connector pins, are electrically connected to the circuit pattern on the circuit board.

According to this invention, it will be unnecessary to use a process whereby the tips of the connector pins are bent. Therefore, cutting costs is easy to achieve. Also, because it is not necessary to bend the tips of the connector pins, there is no risk of problems due to an error in the mutual pitch of the tips of the connector pins; thus, the connector pins are accurately and easily connected to the circuit pattern of the circuit board.

Other objects, characteristics, aspects and benefits of this invention will be understood more clearly in connection with a practical example to be described below, with reference to the drawings.

DETAILED DESCRIPTION OF A PREFERRED EMBODIMENT

The connector utilized in this invention may be either male or female. However, the examples below are described utilizing a female connector.

Figure 1A:
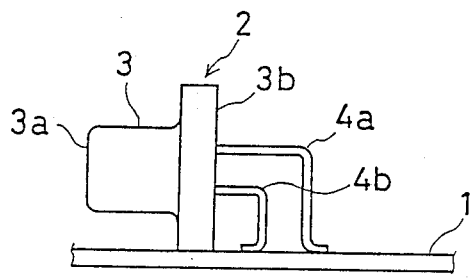
FIGS. 1A, 1B and 1C each show examples of prior art connectors.
Figure 1B:
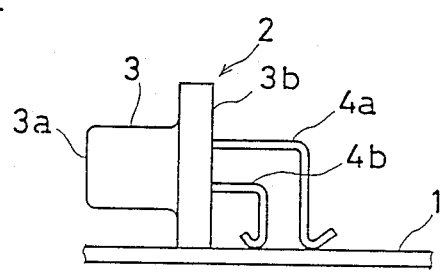
Figure 1C:
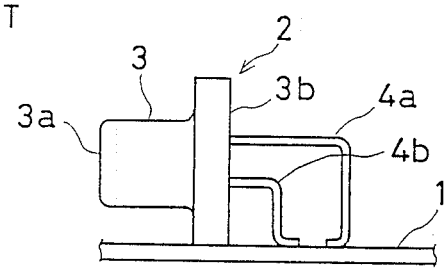
Figure 2:
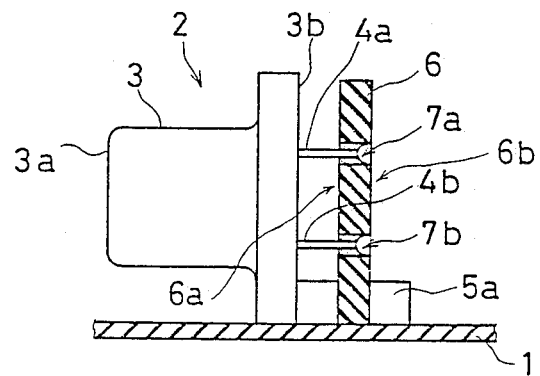
FIG. 2 is a side view, partly in cross-section, of one example of this invention.
Figure 3:
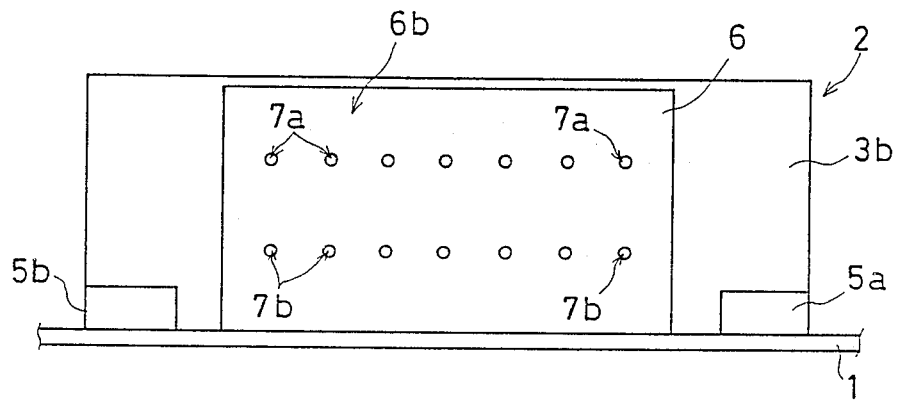
FIG. 3 is a rear elevation of the example of FIG. 2.

With reference to FIGS. 2 and 3, the connector 2 of this practical example is mounted onto the circuit board 1. The female connector 2 comprises a connector housing 3 which has a connector plug 3a on its front. Fourteen upper connector pins 4a (in this embodiment) and fourteen lower connector pins 4b project from the rear 3b of the connector housing 3 and line up in two rows on the top and the bottom. A female circuit device such as a socket or the like (not indicated in any figure) is inserted into the connector plug 3a of the connector housing 3, which permits a male connector (not shown) to be connected to the female connector 2, and thereby electrically connected to the connector pins 4a and 4b.

The connector housing 3 comprises a pair of stabilizing steel angles 5a and 5b, and these steel angles 5a and 5b have screw holes (not indicated in any figure). By inserting screws into the screw holes of the stabilizing steel angles 5a and 5b, the bottom of the connector housing 3 may be secured in contact with the surface of the circuit board 1.

The connector 2 also comprises a connector pin holder 6 which is adjacent to the rear side 3b of the connector housing 3 and the rear side 3b and the front side 6a of the connector pin holder 6 are parallel. This connector pin holder 6 may be composed of insulation material such as glass-epoxy resin, heat resistant plastic or aluminum, although ferrite, which is an effective noise reducer, is preferred. In this connector pin holder 6, through-holes 7a, 7a, . . . and 7b, 7b, . . . are formed, lined up in two rows on the top and bottom. The through-holes 7a and 7b are formed in the same order as the connector pins 4a and 4b; thus, the placement of the connector pins 4a and 4b is analogous to the placement of the through holes 7a and 7b.

Figure 4:
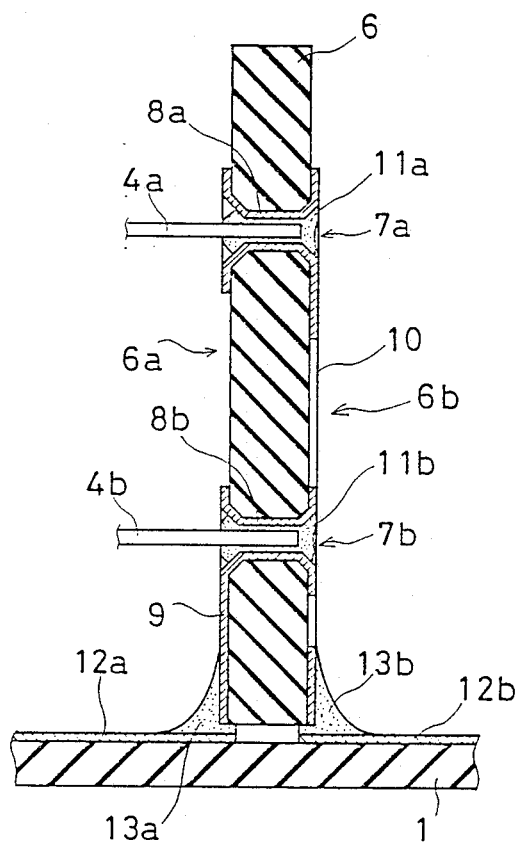
FIG. 4 is an enlarged view of part of FIG. 2, illustrating the interconnection of the connector pins, the connector pin holder and the circuit board in the example.

As indicated in FIG. 4, inside the through holes 7a, 7a . . . and 7b, 7b, . . . formed in the connector pin holder 6, conductors 8a, 8a, . . . and 8b, 8b, . . . are formed. The conductors 8a and 8b also extend from the through-holes 7a and 7b onto the front side 6a and the back side 6b of the connector pin holder 6.

Figure 5A:
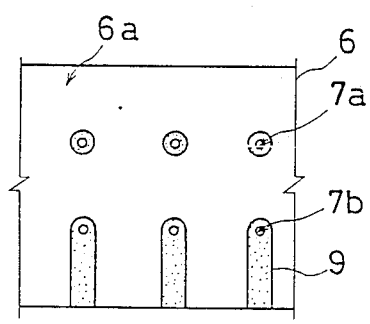
FIG. 5A is an elevation of part of the conductive pattern on the front of the connector pin holder.

On the front side 6a of the connector pin holder 6, as shown in FIGS. 4 and 5A, conductive patterns 9, 9, . . . are formed. One end of each of the conductive patterns 9 reaches the lower end of the connector pin holder 6, and the other end is connected to a respective conductor 8b within a through-hole 7b.

Figure 5B:
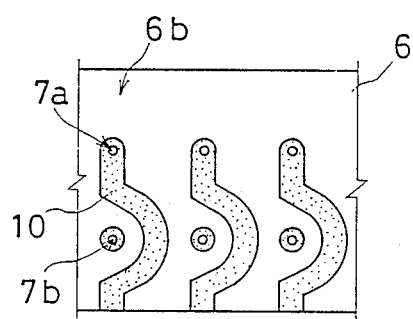
FIG. 5B shows part of the conductive pattern on the back of the connector pin holder.

Also, on the back side 6b of the connector pin holder 6, conductive patterns 10, 10, . . . are formed in a bent shape to avoid the through-hole 7b (as seen most clearly in FIG. 5B).

One end of each conductive pattern 10 is connected to the conductor 8a formed on the inner surface of a respective through-hole 7a located on the upper side of the connector pin holder 6, making an arc and extending downward, and the other end of the conductive pattern 10 extends to the lower end of the connector pin holder 6.

In FIG. 3, the conductive patterns 10 indicated in FIG. 5B are omitted.

With the tips of the corresponding connector pins 4a and 4b inserted into the throughholes 7a and 7b of the connector pin holder 6 as indicated in FIGS. 2 and 4, quantities of solder 11a, . . . and 11b, 11b, . . . are placed in the throughholes 7a and 7b and fill the holes. Thus the connector pins 4a and 4b are electrically connected to the conductor patterns 9 and 10 through the conductors 8a and 8b. Also, the bottom of the connector housing 3 and the bottom of the connector pin holder 6 are positioned within the same plane.

Then, the connector 2, i.e. the combination of the connector housing 3 and the connector pin holder 6, is installed on the circuit board 1. That is, the connector housing 3 is installed on the circuit board 1 by the stabilizing steel angles 5a and 5b, and at the same time the connector pin holder 6 is positioned on the circuit board 1 so as to have its bottom placed over the circuit patterns 12a, 12a, . . . and 12b, 12b, . . . of the circuit board 1. After that, the circuit pattern 12a, and the conductive pattern 9 on the front side 6a of the connector pin holder 6, are connected with solder 13a. The circuit pattern 12b and the conductor pattern 10 on the back side 6b of the connector pin holder 6 are connected with solder 13b. Thus, the connector pin holder 6 and the circuit board are mechanically stabilized and electrically connected. Also, the connector pins 4a and 4b are electrically connected to the circuit patterns 12a and 12b of the circuit board 1 through the conductors 8a, 8b and the conductive patterns 9 and 10.

Figure 6A:
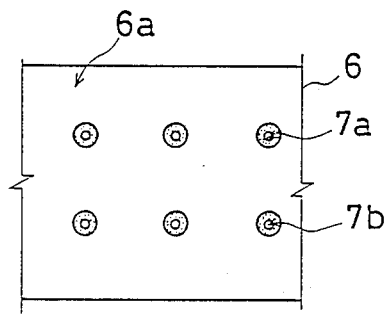
FIGS. 6A and 6B respectively show the front and rear of a connector pin holder according to a second example of the invention.
Figure 6B:
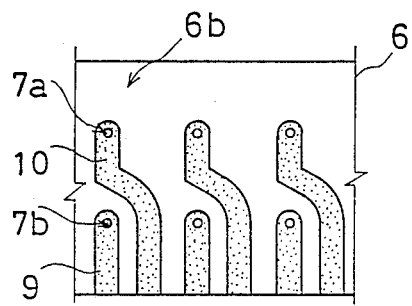

In the practical example shown in FIGS. 4, 5A and 5B, the conductive patterns 9 and 10 were formed on the front side 6a and back side 6b of the conductor pin holder 6. However, as indicated in FIGS. 6A and 6B, the conductive patterns 9 and 10 may both be formed on the back side 6b of the connector pin holder 6. That is, in this example, as indicated in FIG. 6A, no conductive pattern would be formed on the front side 6a of the connector pin holder 6. On the back side 6b of the connector pin holder 6, the conductive patterns 9 and 10 are formed as indicated in FIG. 6B. Each conductive pattern 9 is connected to a conductor 8b which is formed on the inner surface of a through-hole in the lower row, and each conductive pattern 10 is connected to a conductor 8a which is formed on the inner surface of a through-hole 7a in the upper row. Therefore, all of the other ends of the tips of the conductive patterns 9 and 10 are lined up at the lower end on the back side 6a of the connector pin holder 6.

In order to install the connector of the example as indicated in FIGS. 6A and 6B, the circuit board shown in FIG. 4, on which the circuit patterns 12a and 12b are formed to be reciprocally aligned, would be used.

Figure 7A:
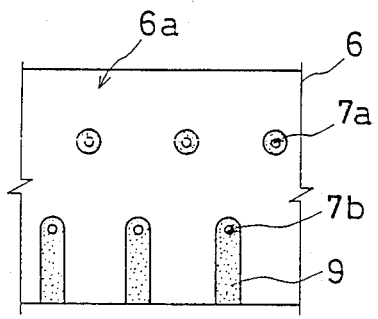
FIGS. 7A and 7B respectively show the front and rear of a connector pin holder according to a third example of this invention.
Figure 7B:
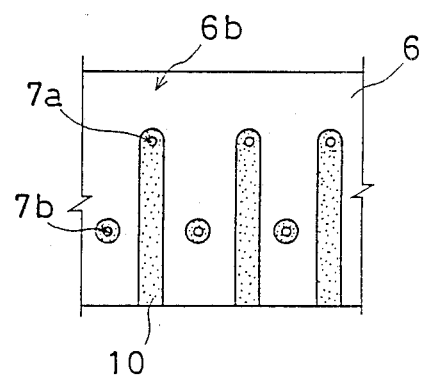

In the example shown in FIGS. 5A, 5B, 6A and 6B, each conductive pattern 10 which is formed on the connector pin holder 6 is shaped in the form of an arc to avoid the through hole 7b and/or the conductive pattern 9. However, if there is enough space, as indicated in FIGS. 7A and 7B, both the conductive patterns 9 and 10 may be straight in shape.

However, the position and the shape of the conductive patterns 9 and 10 formed on the front side 6a and/or the back side 6b of the connector pin holder 6 may be variable, as desired.

In this practical example, the conductors 8a and 8b were formed on the inner surfaces of the through-holes 7a and 7b, and through the conductor 8a and 8b, the connector pins 4a and 4b are connected to the conductive patterns 9 and 10. However, it is also possible for the connector pins 4a and 4b to be inserted into the through-holes 7a and 7b and then directly connected to the conductive patterns 9 and 10, without any conductors 8a and 8b being formed in the through-holes 7a and 7b.

The shapes of the rows, the number, and the spacing of the connector pins 4a and 4b may be variable, as desired.

Also, the conductive patterns 9 and 10 which are formed on the main plane of the connector pin holder 6 may extend past the lower edge of the connector pin holder 6, and may be extended to the lower plane or the bottom of the connector pin holder 6.

Although this invention has been adequately described with reference to the figures, the disclosed embodiment is to be viewed only as one type of example. Rather, this example is not to be understood as limiting the possibilities, and the spirit and scope of this invention are limited only by the terms of the following claims.

What is claimed is:

1. A surface mounting-type connector, comprising:
  a connector housing having an insertion portion on a front side thereof to which an insertion portion of a connector that is to be connected to said surface mounting-type connector is inserted; said bottom surface of said connector housing being adapted to be placed directly on a printed circuit board such that said connector housing is fixed on the printed circuit board;

a plurality of electrical-connector pins housed in said connector housing such that respective tip ends are projected from a rear of said connector housing, said connector housing having a bottom surface;

a connector-pin holder having predetermined construction extending downwardly to a bottom surface, a first main side spaced in confronting manner to a rear side of said connector housing, a second main side, and a plurality of through holes from said first to said second side; respective ones of said plurality of through holes corresponding in position to respective ones of said plurality of electrical-connector pins, said bottom surface disposed in substantially the same plane as said bottom surface of said connector housing and adapted to be placed directly on a printed circuit board;

a respective conductive pattern on at least one of said first and second sides of said connector-pin holder being electrically and mechanically fixedly connected to a circuit pattern on the printed circuit board; and a plurality of conductive patterns formed in a predetermined relation to said through holes on a main surface of said connector-pin holder;

tip ends of said electrical-connector pins being respectively inserted into said through holes of said connector-pin holder and electrically connected to said conductive patterns;

said bottom surface of said connector housing and said connector-pin holder being free of depending projections for protruding through the printed circuit board; and said connector-pin holder providing the sole electrically-conductive connections between said electrical-connector pins and the printed circuit board.

2. The surface mounting-type connector as claimed in claim 1, having conductors formed on the inner surfaces of the through holes in the connector-pin holder, and said connector pins being connected by said conductors to said conductive patterns.

3. The surface mounting-type connector as claimed in claim 1, further comprising a steel angle which is angled so as to secure and stabilize said connector housing on the circuit board.

4. The surface mounting-type connector as claimed in claim 1, wherein said connector housing and said connector-pin holder are interconnected substantially only by said plurality of electrical-connector pins.

5. The surface mounting-type connector as claimed in claim 1, wherein respective conductive patterns on both said first and second sides of said connector-pin holder are electrically and mechanically fixedly connected to circuit patterns on the printed circuit board.

* * * * *